US008492761B2

(12) United States Patent
Abe et al.

(10) Patent No.: US 8,492,761 B2
(45) Date of Patent: Jul. 23, 2013

(54) FIELD-EFFECT TRANSISTOR AND METHOD FOR FABRICATING FIELD-EFFECT TRANSISTOR

(75) Inventors: Yukiko Abe, Kanagawa (JP); Naoyuki Ueda, Kanagawa (JP); Yuki Nakamura, Tokyo (JP); Yuji Sone, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/587,744

(22) Filed: Aug. 16, 2012

(65) Prior Publication Data

US 2012/0305915 A1 Dec. 6, 2012

Related U.S. Application Data

(63) Continuation of application No. 12/831,454, filed on Jul. 7, 2010, now Pat. No. 8,268,666.

(30) Foreign Application Priority Data

Jul. 9, 2009 (JP) ................................. 2009-163076
Jun. 9, 2010 (JP) ................................. 2010-131676

(51) Int. Cl.
*H01L 29/10* (2006.01)

(52) U.S. Cl.
USPC ...... 257/43; 257/288; 257/347; 257/E29.296; 257/E21.461; 438/104; 438/149; 438/479

(58) Field of Classification Search
USPC ............ 257/43, 288, 347, E29.296, E21.461; 438/104, 149, 479
See application file for complete search history.

(56) References Cited

U.S. PATENT DOCUMENTS

| 7,067,843 | B2 | 6/2006 | Carcia et al. | |
|---|---|---|---|---|
| 7,297,977 | B2 | 11/2007 | Hoffman et al. | |
| 7,674,650 | B2 | 3/2010 | Akimoto et al. | |
| 8,003,981 | B2 * | 8/2011 | Iwasaki et al. | 257/43 |
| 2005/0039670 | A1 | 2/2005 | Hosono et al. | |
| 2005/0199960 | A1 | 9/2005 | Hoffman et al. | |
| 2006/0108636 | A1 | 5/2006 | Sano et al. | |
| 2006/0110867 | A1 | 5/2006 | Yabuta et al. | |
| 2006/0113536 | A1 | 6/2006 | Kumomi et al. | |
| 2008/0248288 | A1 | 10/2008 | Boardman | |

(Continued)

FOREIGN PATENT DOCUMENTS

| JP | 5-238807 | 9/1993 |
|---|---|---|
| JP | 8-185729 | 7/1996 |

(Continued)

OTHER PUBLICATIONS

Sep. 27, 2011 Korean official action (with English translation) in connection with a counterpart Korean patent application.

(Continued)

*Primary Examiner* — Tu-Tu Ho
(74) *Attorney, Agent, or Firm* — Cooper & Dunham LLP

(57) ABSTRACT

A method for fabricating a field-effect transistor having a gate electrode, a source electrode, a drain electrode, and an active layer forming a channel region, the active layer having an oxide semiconductor mainly containing magnesium and indium is disclosed. The method includes a deposition step of depositing an oxide film, a patterning step of patterning the oxide film by processes including etching to obtain the active layer, and a heat-treatment step of heat-treating the obtained active layer subsequent to the patterning step.

8 Claims, 12 Drawing Sheets

U.S. PATENT DOCUMENTS

| | | |
|---|---|---|
| 2009/0090914 A1 | 4/2009 | Yano et al. |
| 2011/0006299 A1 | 1/2011 | Abe et al. |
| 2011/0128275 A1 | 6/2011 | Ueda et al. |

FOREIGN PATENT DOCUMENTS

| | | |
|---|---|---|
| JP | 2000-228516 | 8/2000 |
| JP | 2002-76356 | 3/2002 |
| JP | 2004-103957 | 4/2004 |
| JP | 2005-39173 | 2/2005 |
| JP | 2006-165528 | 6/2006 |
| JP | 2006-165531 | 6/2006 |
| JP | 2007-250982 | 9/2007 |
| JP | 2007-529119 | 10/2007 |
| KR | 10-2008-0074888 | 8/2008 |
| KR | 10-2008-0103572 | 11/2008 |
| WO | WO2006/051993 A2 | 5/2006 |
| WO | WO2007/058248 A1 | 5/2007 |
| WO | WO2007/108293 A1 | 9/2007 |
| WO | WO 2008/096768 | 8/2008 |
| WO | WO 2010/047077 | 4/2010 |

OTHER PUBLICATIONS

International Search Report in PCT/JP2009/064535. (mailed Oct 6, 2009).

Hikuma, Naoko, et al. (1992), "New Transparent Electroconductive Oxide 2. Chemical State and Optical-Electrical Properties of Sintered $MgIn_2O_{4-1}$," The Japan Society of Applied Physics and Related Societies (The $39^{th}$ Spring Meeting, 1992), Extended Abstracts, No. 3, p. 851, (with English translation).

Ueda, Naoyuki, et al. (1992), "New oxide phas with wide band gap and high Electroconductivity, $MgIn_2O_4$," Appl. Phys. Lett, 61(16), pp. 1954-1955.

Omata, Takahisa, et al. (1993), "New ultraviolet-transport electroconductive oxide, $ZnGa_2O_4$ spinel," Appl. Phys. Lett. 64(9), pp. 1077-1078.

Nomura K. et al., (2003) "Thin-Film Transistor Fabricated in Single-Crystalline Transparent Oxide Semiconductor." Science, vol. 300, No. 23, pp. 1269-1272.

Nomura K. et al., (2004) "Room-temperature fabrication of transparent flexible thin-film transistors using amorphous oxide semiconductors," Nature, vol. 432, No. 25, pp. 488-492.

European Search Report dated Apr. 29, 2013 in corresponding European patent application No. 10 16 8749.9.

Kudo A et al., "Enhancement of carrier generation in MgIn2O4 think film prepared by pulse Laser deposition technique", Materials Science and Engineering, 1998, vol. 54, 51-54.

* cited by examiner

FIELD-EFFECT TRANSISTOR AND METHOD FOR FABRICATING FIELD-EFFECT TRANSISTOR

CROSS-REFERENCE TO RELATED APPLICATIONS

This application is a Rule 1.53(b) continuation of application Ser. No. 12/831,454, filed Jul. 7, 2010 now U.S. Pat. No. 8,268,666 which claims priority under 35 U.S.C. §119 of Japanese patent applications Nos. 2009-163076 and 2010-131676 filed with the Japanese Patent Office on Jul. 9, 2009 and Jun. 9, 2010, respectively.

BACKGROUND OF THE INVENTION

1. Field of the Invention

The invention generally relates to a field-effect transistor including an active layer having an oxide semiconductor, and a method for fabricating the field-effect transistor.

2. Description of the Related Art

The field-effect transistor (FET) is a transistor that controls current between a source electrode and a drain electrode based on the principle of applying a voltage to a gate electrode to generate an electric field in a channel, whereby the gate is provided for the flows of electrons or holes. Based on the characteristics of FET, the FET is generally used as a switching device or amplifier device. The FET generally has a low gate current and a planar structure, which facilitate the fabrication or integration of the FET easier than a bipolar transistor. Accordingly, the FET is considered as one of the critical devices among the currently available integrated circuits in electronic devices. The FET may be applied as a thin film transistor (TFT) to an active matrix display.

Examples of a flat panel display (FPD) include liquid crystal displays, organic electroluminescent displays, and electronic paper. These types of FPD are generally driven by a drive circuit including a TFT having amorphous silicon or polysilicon as an active layer. Since the FPDs have increasingly been desired to have large sizes, high definition, and high driving rates, the TFTs need to have high carrier mobility, high ON/OFF ratios, and small device variability.

However, the TFTs having amorphous silicon or polysilicon as the active layer have their advantages and disadvantages, and hence it is difficult to simultaneously satisfy all the requirements. Moreover, the use of a flexible substrate such as a plastic film for the TFTs has been examined in view of fabricating displays having lightweight, high flexibility, and high impact resistance properties at a relatively low fabrication cost. In this case, however, since silicon needs to be treated at a relatively high temperature in a fabrication process, it is inappropriate to use silicon in the fabrication of TFTs in view of heat resistance of the substrate.

In order to satisfy the above-described requirements, numerous studies have been conducted and disclosed, for example, in U.S. Pat. No. 7,067,843 (hereinafter referred to as "Patent Document 1"), SCIENCE, VOL300, 23, MAY, 2003, p. 1269-1272 (hereinafter referred to as "Non-Patent Document 1" disclosed by K. Nomura et al., "Thin-Film Transistor Fabricated in Single-Crystalline Transparent Oxide Semiconductor", SCIENCE, VOL300, 23, MAY, 2003, p. 1269-1272), and NATURE, VOL432, 25, NOVEMBER, 2004, p. 488-492 (hereinafter referred to as "Non-Patent Document 2" disclosed by K. Nomura et al., "Room-temperature fabrication of transparent flexible thin-film transistors using amorphous oxide semiconductors", NATURE, VOL432, 25, NOVEMBER, 2004, p. 488-492) on the development of TFTs including oxide semiconductors having an expected carrier mobility higher than that of the amorphous silicon. Patent Document 1 discloses a TFT having ZnO for an active layer. Non-Patent Document 1 discloses a TFT having a single crystal $InGaO_3(ZnO)_5$ for a channel. Non-Patent Document 2 discloses a TFT having an amorphous In—Ga—Zn oxide for an active layer.

However, since the crystal structure of ZnO or In—Ga—Zn oxide is a hexagonal wurtzite structure or homologous series that exhibits a high anisotropy, it may be critical to control the orientation in the thin film. Accordingly, it is difficult to apply such a thin film to a large sized screen display.

Further, the amorphous In—Ga—Zn oxide has a property to easily undergo crystallization when Zn concentration is increased to achieve the high mobility.

Various studies suggest that a field-effect transistor having an oxide semiconductor mainly composed of magnesium (Mg) and indium (In) as an active layer eliminate the above drawbacks. Since the oxide semiconductor mainly composed of Mg and In has the crystal structure indicating its transportation characteristic being independent of the orientation of the thin film, the orientation of the thin film may not need to be controlled. Moreover, with such an oxide semiconductor mainly composed of Mg and In, high mobility and uniform characteristics may be achieved regardless of types (amorphous or crystal) of the oxide semiconductor.

However, evaluation of the field-effect transistor having the oxide semiconductor mainly composed of Mg and In as the active layer has shown that the active layer of the field-effect transistor is damaged while patterning the active layer by etching, which has eventually resulted in degrading field-effect transistor characteristics in an OFF-state.

Specifically, having compared the transistor characteristics before and after the patterning is carried out on the active layer by etching, the field-effect transistor after the patterning has exhibited degraded transistor characteristics, such as significant depletion characteristics and significant variability in the transistor characteristics between the samples.

An increase of current in on OFF-state is undesirable because it may induce the leak current or a decrease in the ON/OFF ratio. The significant depletion characteristics are also undesirable because it may require a gate voltage having a larger absolute value to switch the transistor to an OFF-state. Further, the variability in the transistor characteristics between the samples eventually results in the variability in device characteristics. That is, the above-described transistor degradation may result in the degradation of the display when the transistor is used as the drive circuit of the display.

SUMMARY OF THE INVENTION

Accordingly, embodiments of the invention attempt to provide a method for fabricating a field-effect transistor having an active layer mainly containing Mg and In capable of preventing damage to the active layer while patterning the active layer by etching in a patterning step, and a field-effect transistor fabricated by such a method so that the produced field-effect transistor is hardly damaged, which substantially eliminates one or more problems caused by the limitations and disadvantages of the related art.

In one embodiment, there is provided a method for fabricating a field-effect transistor having a gate electrode, a source electrode, a drain electrode, and an active layer forming a channel region, the active layer having an oxide semiconductor mainly containing magnesium and indium. The method includes a deposition step of depositing an oxide film, a patterning step of patterning the oxide film by processes including etching to obtain the active layer, and a heat-treatment step of heat-treating the obtained active layer subsequent to the patterning step.

In another embodiment, there is provided a field-effect transistor that includes a gate electrode configured to apply a gate voltage; a source electrode and a drain electrode configured to acquire a current; an active layer arranged adjacent to the source electrode and the drain electrode, the active layer forming a channel region and having an oxide semiconductor mainly containing magnesium and indium; and a gate insulating layer arranged between the gate electrode and the active layer, where a concentration of hydrogen atoms in the active layer near an interface between the active layer and the gate insulating film is equal to or lower than $10^{21}/cm^3$.

Other objects and further features of embodiments will be apparent from the following detailed description when read in conjunction with the accompanying drawings.

DESCRIPTION OF THE PREFERRED EMBODIMENTS

In the following, embodiments for carrying out the present invention will be described by referring to the accompanying drawings.

EMBODIMENT

Configuration of Field-Effect Transistor According to Embodiment

Figure 1:
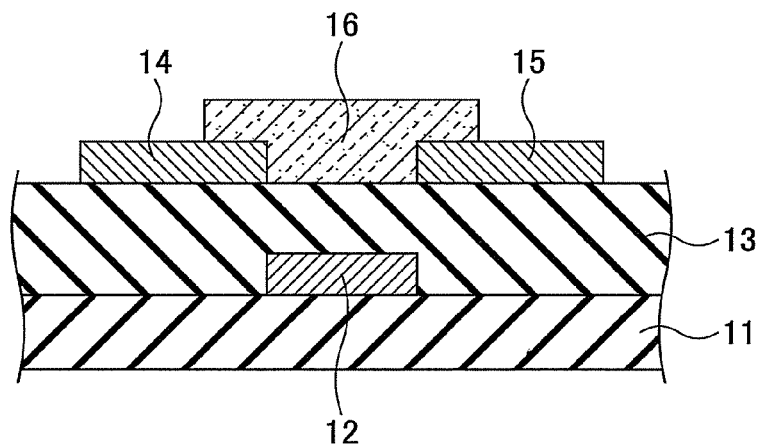
FIG. 1 is a sectional view illustrating an example of a field-effect transistor according to an embodiment.

First, a schematic configuration of a field-effect transistor according to an embodiment is described. FIG. 1 is a sectional view illustrating an example of the field-effect transistor according to the embodiment. As illustrated in FIG. 1, a field-effect transistor 10 includes a substrate 11, a gate electrode 12, a gate insulating film 13, a source electrode 14, a drain electrode 15, and an active layer 16.

In the field-effect transistor 10, the gate electrode 12 is formed on the substrate 11, and the gate insulating film 13 is formed to cover the gate electrode 12. The source electrode 14 and the drain electrode 15 formed on the gate insulating film 13 such that the source electrode 14 and the drain electrode 15 have a predetermined distance to form a channel region in the active layer 16 between them. The active layer 16 forming the channel region is formed to cover part of the source electrode 14 and part of the drain electrode 15 formed on the gate insulating film 13. The active layer 16 is formed such that the active layer 16 faces the gate electrode 12 via the gate insulating film 13.

As examples of a material for the substrate 11, a glass substrate, a ceramic substrate, a plastic substrate, a film substrate, and the like may be employed. Examples of a material for the gate electrode 12 include metal films each formed of a single metal element including aluminum (Al), chromium (Cr), gold (Au), silver (Ag), tantalum (Ta), indium (In), molybdenum (Mo), tungsten (W), nickel (Ni), titanium (Ti); metal laminate films each formed of plural metal films; alloy films each containing plural metals; a conductive oxide film composed of $In_2O_3$, $SnO_2$, or ZnO; a conductive oxide film composed of tin added $In_2O_3$ (ITO), gallium (Ga) added ZnO, aluminum (Al) added ZnO, and antimony (Sb) added $SnO_2$; and films composed of fine particle dispersion of the above materials. The thickness of the gate electrode 12 ranges from 10 nm to 200 nm.

Examples of a material for the gate insulating film 13 include oxides exhibiting insulation such as $SiO_2$, $Al_2O_3$, $Ta_2O_5$, $Y_2O_3$, $La_2O_3$, $HfO_2$, $Nb_2O_3$, $ZrO_2$, and the like; organic insulating materials, and SiNx. The thickness of the gate insulating film 13 ranges from 50 nm to 500 nm.

Examples of materials for the source electrode 14 and the drain electrode 15 include metal films each formed of a single metal element including aluminum (Al), chromium (Cr), gold (Au), silver (Ag), tantalum (Ta), indium (In), molybdenum (Mo), tungsten (W), nickel (Ni), titanium (Ti); metal laminate films each formed of plural metal films; alloy films each containing plural metals; a conductive oxide film composed of $In_2O_3$, $SnO_2$, or ZnO; a conductive oxide film composed of tin added $In_2O_3$ (ITO), gallium (Ga) added ZnO, aluminum (Al) added ZnO, and antimony (Sb) added $SnO_2$; and films composed of fine particle dispersion of the above materials. The thickness of the source electrode 14 and the drain electrode 15 each range from 10 nm to 200 nm.

A material for the active layer 16 includes an oxide semiconductor mainly composed of Mg and In. A specific example of the oxide semiconductor includes a polycrystalline film having a composition of $In_2MgO_4$. The thickness of the active layer 16 ranges from 10 nm to 200 nm.

Note that the oxide semiconductor may not be limited to the polycrystalline film having a composition of $In_2MgO_4$, but may include the following examples. For example, a material obtained by substituting at least one of aluminum (Al) and gallium (Ga) for indium (In) in $In_2MgO_4$ may be used for the active layer 16. In this case, a band gap, energy at a bottom of a conductive band, and lattice energy of oxygen atoms may be controlled based on types of the substitution element and its substitution amount. For example, an ultraviolet (UV) transparent region may be enlarged by increasing the substitution amount of the substitution element. Further, the increase of the substitution amount of the substitution element may increase the energy level of the conductive band, thereby reducing the generation of electron carriers.

In addition, a material obtained by substituting at least one of calcium (Cu) and barium (Ba) for magnesium (Mg) in $In_2MgO_4$ may be used for the active layer 16.

The oxide semiconductor constituting the active layer 16 may include an amorphous structure, a spinel structure including an inverse-spinel structure, or an olivine structure. Further, the oxide semiconductor constituting the active layer 16 may include mixed structures of a crystal structure and an amorphous structure. Further, the oxide semiconductor constituting the active layer 16 may include mixed phases of a phase having the spinel structure and a phase having the olivine structure. Further, in the oxide semiconductor constituting the active layer 16, at least one of nitrogen and fluorine may be substituted for oxygen. In this case, an amount of oxygen in the oxide semiconductor may be accurately controlled.

Figure 2:
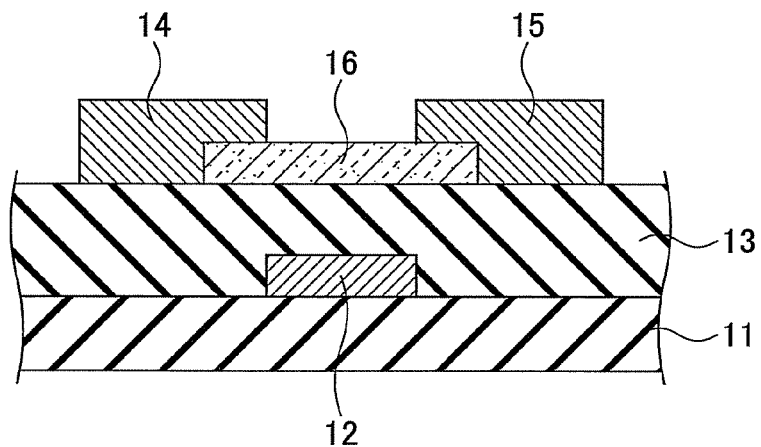
FIG. 2 is a sectional view illustrating another example of the field-effect transistor according to the embodiment.

FIG. 2 is a sectional view illustrating another example of the field-effect transistor according to the embodiment. In FIG. 2, the same reference numerals are assigned to components identical to those of FIG. 1, and the descriptions thereof are omitted. As illustrated in FIG. 2, a field-effect transistor 20 is a "top-contact/bottom-gate" type field-effect transistor (FET). The field-effect transistor according to the embodiment is not limited to a "bottom-contact/bottom-gate" type as illustrated in FIG. 1, but includes the "top-contact/bottom-gate" type, unshown "bottom-contact/top-gate" type, and unshown "top-contact/top-gate" type field-effect transistors. So far, the schematic configuration of the field-effect transistor according to the embodiment is described.

Fabrication Method for Field-Effect Transistor According to Embodiment

Next, a method for fabricating the field-effect transistor may be schematically illustrated on the basis of the "bottom-contact/bottom-gate" type field-effect transistor illustrated in FIG. 1 as an example. FIGS. 3A through 3E are views illustrating exemplified steps of a process for fabricating the field-effect transistor according to the embodiment. In FIGS. 3A through 3E, the same reference numerals are assigned to components identical to those of FIG. 1, and the descriptions thereof are omitted. Below, the method for fabricating the field-effect transistor 10 is described with reference to FIGS. 3A through 3E.

Figure 3A:
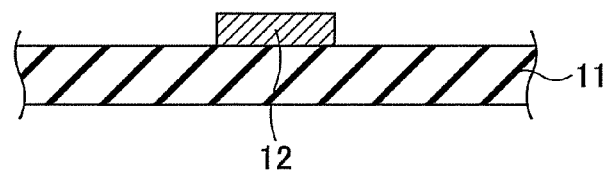
FIGS. 3A through 3E are views illustrating exemplified steps of a process for fabricating the field-effect transistor according to the embodiment.

As illustrated in FIG. 3A, a conductive film made of aluminum (Al) is initially deposited on a substrate 11 made of a glass substrate, and a pattern is etched into the deposited conductive film to form the gate electrode 12.

Figure 3B:
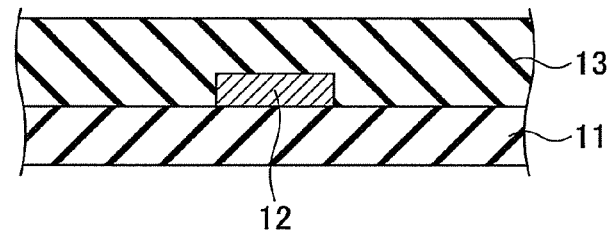
Figure 3C:
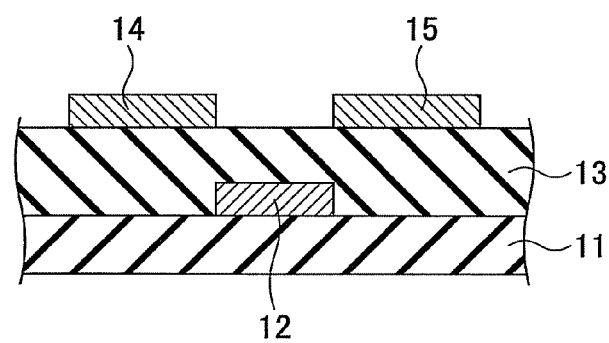

As illustrated in FIG. 3B, the gate insulating film 13 made of $SiO_2$ is subsequently formed on the substrate 11 by sputtering so as to cover the gate electrode 12. As illustrated in FIG. 3C, a conductive film made of ITO is formed on the gate insulating film 13 by sputtering, and pattern is etched into the conductive film to form the source electrode 14 and the drain electrode 15.

Figure 3D:
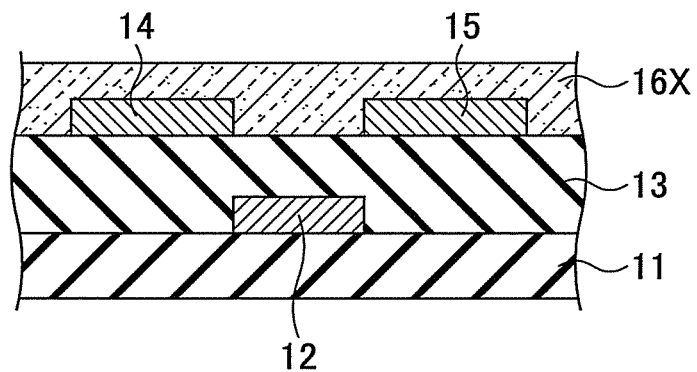
Figure 3E:
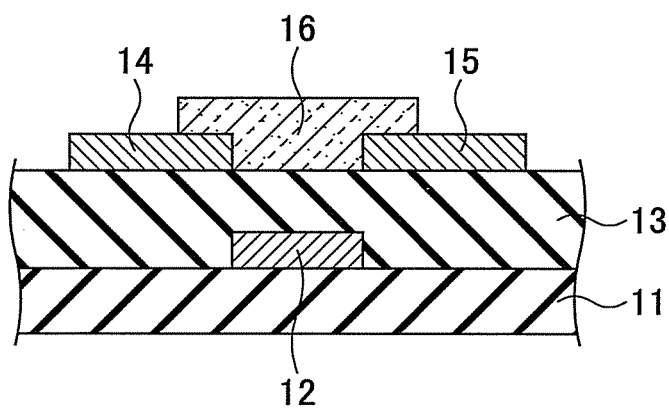

As illustrated in FIG. 3D, an oxide film 16x mainly composed of Mg and In is formed on the gate insulating film 13 by sputtering so as to cover a channel region formed between the source electrode 14 and the drain electrode 15 (deposition step). As illustrated in FIG. 3E, a pattern is etched into the oxide film 16x obtained in the above deposition step to form the active layer 16 (patterning step). Thereafter, the active layer 16 is, after the patterning step has been conducted, heat-treated at a temperature (e.g., 300° C.) higher than the temperature at which the oxide film 16x is deposited in FIG. 3D (heat treatment step). The field-effect transistor according to the embodiment is thus obtained. So far, the schematic fabrication method for the field-effect transistor according to the embodiment is described.

The results of various experiments have shown that damage to the active layer 16 can be prevented by providing the heat treatment step in which the active layer 16 is heat-treated at a temperature higher than the temperature at which the oxide film 16x is deposited in the deposition step of FIG. 3D after the patterning step of FIG. 3E. As a result, degradation of characteristics of the field-effect transistor while the transistor is in an OFF-state may be prevented. Note that in the heat treatment step, it is sufficient to heat-treat at least a portion of the active layer 16 that forms the channel region. Below, Examples and Comparative Examples are described with reference to the accompanying drawings.

Example 1

Figure 4:
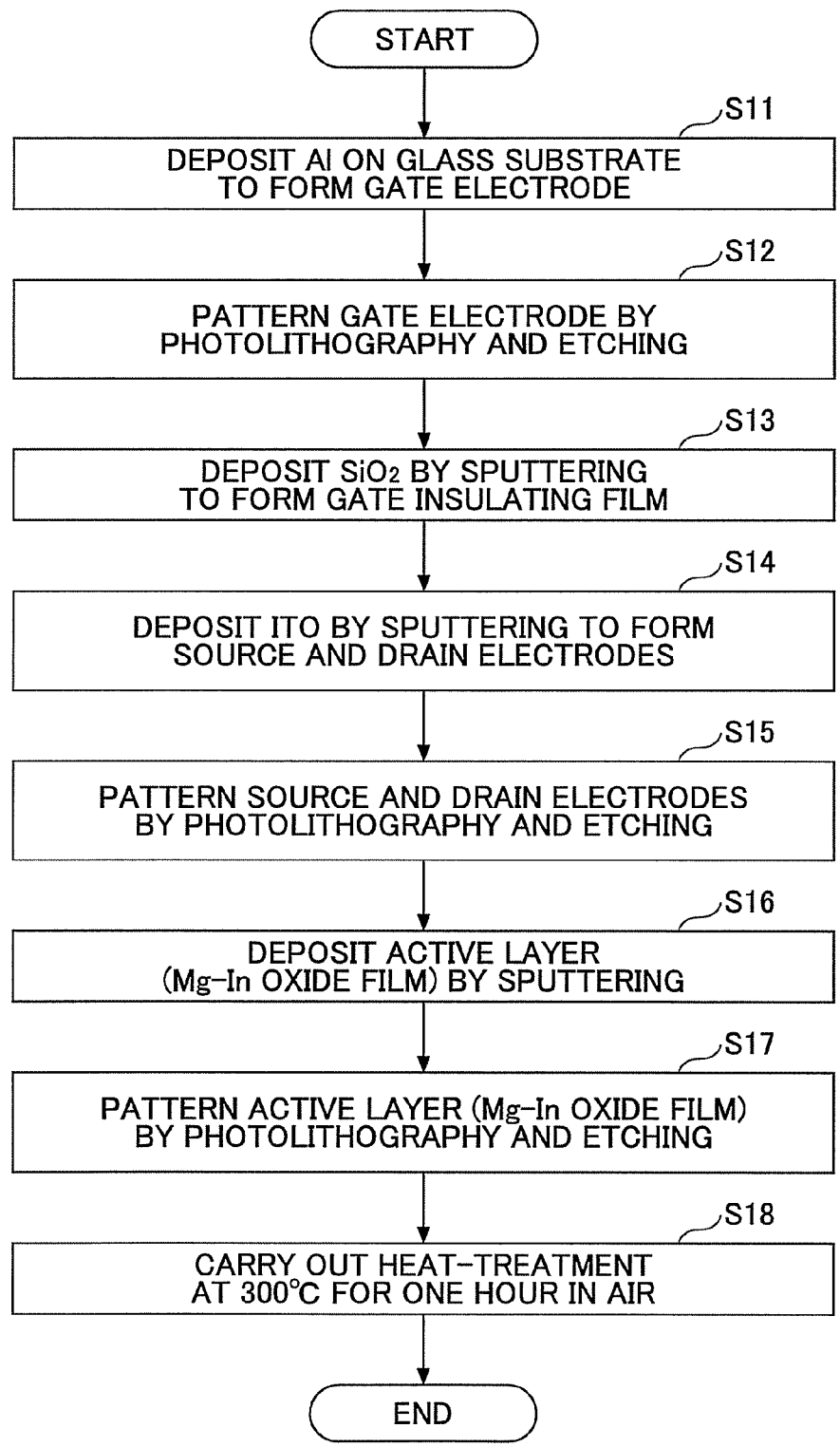
FIG. 4 is a flowchart illustrating a method for fabricating the field-effect transistor according to the embodiment.

FIG. 4 is a flowchart illustrating a method for fabricating the field-effect transistor according to the embodiment in Example 1. In Example 1, the field-effect transistor 10 of FIG. 1 was fabricated by following steps S11 through S18, and characteristics of the field-effect transistor 10 were evaluated. Note that a field-effect transistor of Example 1 indicates the field-effect transistor 10 fabricated by following the steps S11 through S18 illustrated in FIG. 4.

The method for fabricating the field-effect transistor of Example 1 is described below with reference to FIG. 4. In step S11, aluminum (Al) was deposited on the glass substrate 11 so as to have a deposited thickness of 100 nm. In step S12, the deposited aluminum (Al) was patterned in lines by etching and photolithography so as to form the gate electrode 12.

In step S13, $SiO_2$ was deposited with a thickness of 200 nm by sputtering so as to form the gate insulating film 13 to cover the gate electrode 12. In step S14, ITO was deposited with a thickness of 100 nm by sputtering over the insulating film 13. In step S15, the ITO film deposited by sputtering in step S14 was patterned to form geometries of the source electrode 14 and the drain electrode 15 by photolithography and etching.

In step S16, an Mg—In oxide film utilized as the active layer 16 was deposited by sputtering to cover part of the source electrode 14 and part of the drain electrode 15. In this step, a polycrystalline sintered member having a composition of $In_2MgO_4$ is used as a sputtering target. A mixture of argon (Ar) and oxygen ($O_2$) was used as a sputtering atmosphere, and a ratio of oxygen to argon was adjusted at 1.5%. Subsequently, the Mg—In oxide film with a thickness of 100 nm was deposited by sputtering at the sputter power of 150 W for 25 minutes. Note that the substrate temperature of the substrate 11 was not controlled in step S16. As already known, the substrate temperature of the substrate 11 rises spontaneously during the sputtering but it remains at 40° C. or lower. Therefore, the deposition temperature of the Mg—In oxide film is 40° C. or lower.

In step S17, the Mg—In oxide film deposited by sputtering in step S16 is patterned to form geometry of the active layer 16 by photolithography or wet-etching. An etchant mainly composed of an oxalic acid solution was used for the wet-etching. As a result, a transistor (i.e., field-effect transistor) having a channel length of 5 μm and a channel width of 40 μm was formed.

In step S18, the transistor formed in step S17 was subsequently heat-treated at a temperature equal to or higher than the deposition temperature of the Mg—In oxide film (i.e., at 40° C. or higher in Example 1). Note that in the heat treatment step of step S18, it is sufficient that at least a portion of the active layer 16 that forms the channel region be heat-treated. In Example 1, the active layer 16 was heat-treated at 300° C. for one hour in an oven. Note that the active layer 16 was heat-treated in air (step S18).

Figure 5:
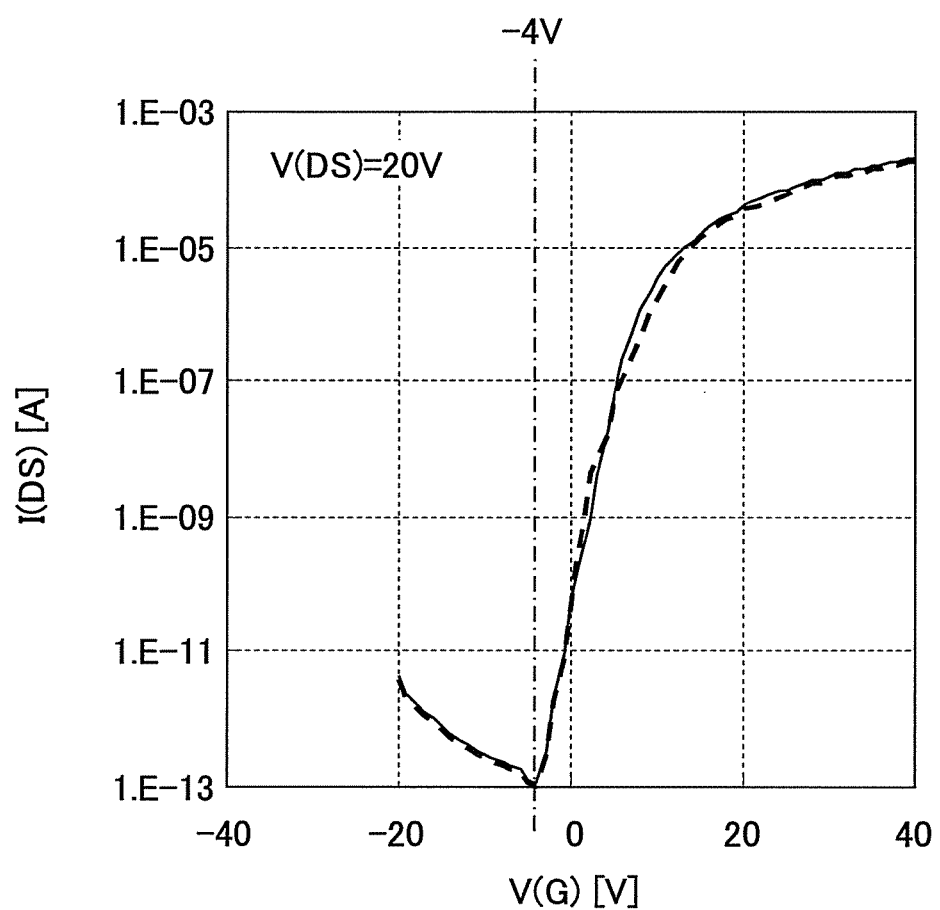
FIG. 5 is a graph illustrating characteristics of the field-effect transistor according to the embodiment obtained in Example 1.

The field-effect transistor fabricated by following the above steps S11 through S18 is a typical n-type transistor that employs electrons as carriers. FIG. 5 is a graph illustrating characteristics of the field-effect transistor of Example 1. FIG. 5 illustrates a relationship between a gate voltage V(G) and a source-drain current interval I(DS) in the field-effect transistor of Example 1 when a source-drain voltage V(DS) is set at 20 V.

As illustrated by a solid line in FIG. 5, when the gate voltage V(G) was equal to or lower than −4 V (i.e., −4 V or lower voltage was applied to the gate electrode 12), the field-effect transistor of Example 1 became an OFF-state, and hence, an OFF-current value obtained at the gate voltage V(G)=−4 V was approximately 0.1 pA. When the gate voltage V(G) exceeded −4 V, the source-drain current interval I(DS) was increased, and hence, the ON-current value obtained at the gate voltage V(G)=20 V reached 30 μA. The field-effect mobility obtained in a saturation region was 2.9 cm$^2$/Vs, and an excellent ON/OFF ratio that exceeds eight orders of magnitude was obtained.

A sample of the field-effect transistor was fabricated by following the same steps S11 through S18, and characteristics of the sample were evaluated. The result of the evaluation is shown by a dotted line in FIG. 5. As illustrated in FIG. 5, the solid line illustrating the characteristics of Example 1 approximately matches the dotted line illustrating the characteristics of the sample, showing an extremely small variability in the characteristics between the field-effect transistor fabricated in Example 1 and the sample.

Comparative Example 1

In Comparative Example 1, a field-effect transistor 10 of FIG. 1 was fabricated by following steps S11 through 17 illustrated in FIG. 4, and characteristics of the field-effect transistor 10 were evaluated. Note that the field-effect transistor of Comparative Example 1 indicates the field-effect transistor 10 fabricated by following the steps S11 through 17 illustrated in FIG. 4. The field-effect transistor of Comparative Example 1 differs from that of Example 1 in that the field-effect transistor of Comparative Example 1 was fabricated without carrying out the step S18 illustrated in FIG. 4.

Figure 6:
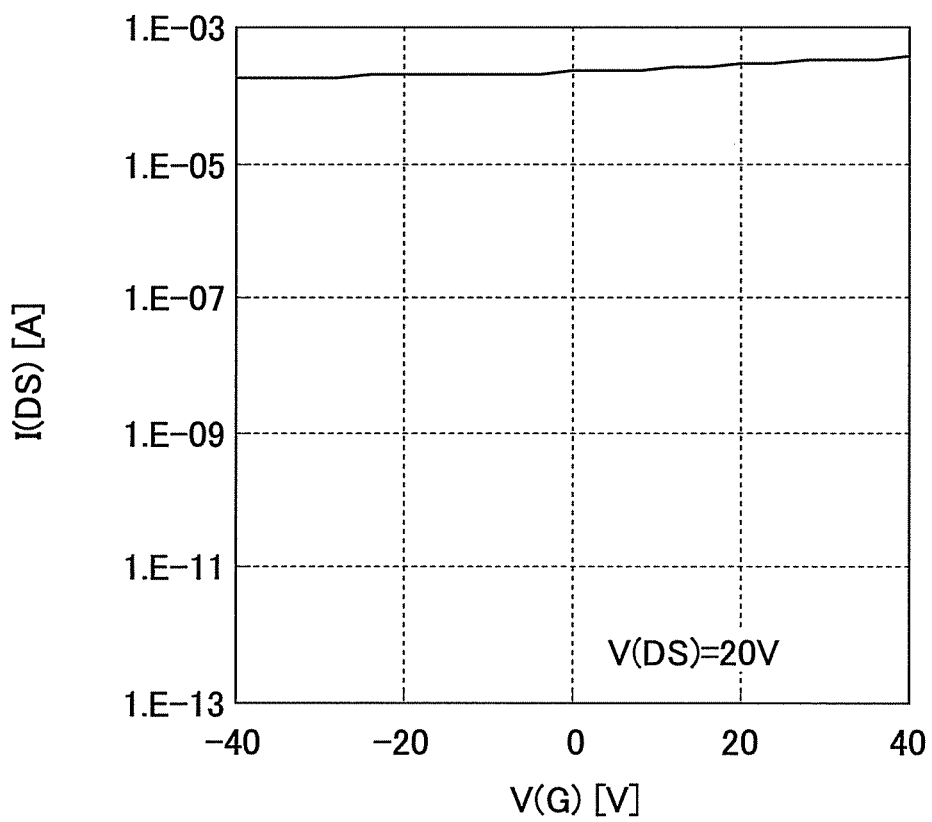
FIG. 6 is a graph illustrating characteristics of a field-effect transistor obtained in Comparative Example 1.

FIG. 6 is a graph illustrating characteristics of the field-effect transistor of Comparative Example 1. FIG. 6 illustrates a relationship between a gate voltage V(G) and a source-drain current interval I(DS) in the field-effect transistor of Comparative Example 1 when a source-drain voltage V(DS) is set at 20 V. As illustrated in FIG. 6, the transistor did not switch ON or OFF and thus was not switched to an OFF-state in the gate voltage V(G) range of −40 V to 40 V.

As can be clear from the results of Example 1 and Comparative Example 1, the field-effect transistor having the oxide semiconductor mainly composed of Mg and In as an active layer may be fabricated without causing damage to its active layer or the degradation in the OFF-state transistor characteristics, provided that the heat-treatment step was added to the steps of its fabrication method. Note that in the heat-treatment step, the active layer was heat-treated at a temperature equal to or higher than the deposition temperature of the Mg—In oxide film.

Comparative Example 2

Figure 7:
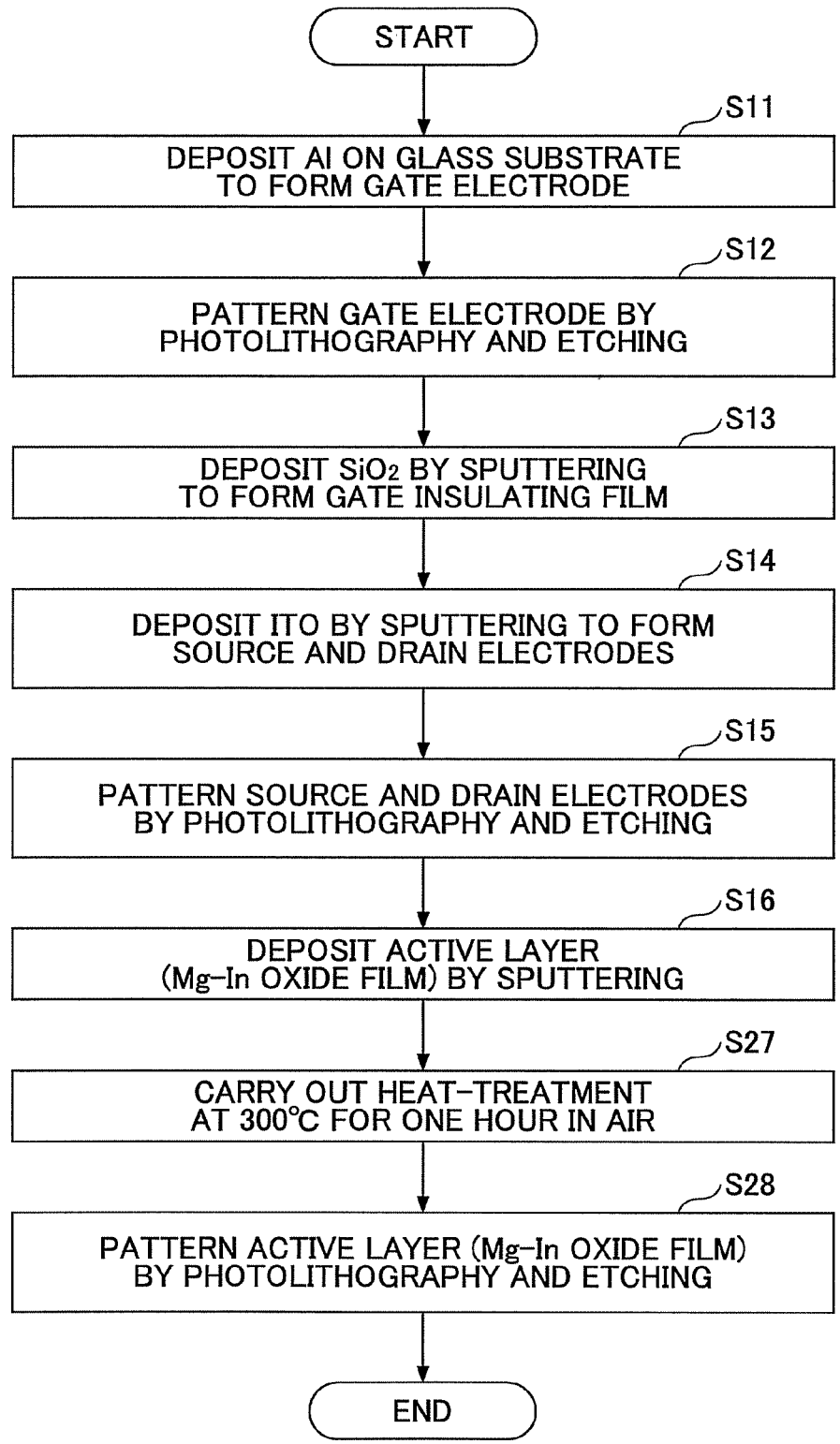
FIG. 7 is a flowchart illustrating a method for fabricating a field-effect transistor used in Comparative Example 2.

FIG. 7 is a flowchart illustrating a method for fabricating the field-effect transistor of Comparative Example 2. In FIG. 7, the same reference numerals are assigned to steps identical to those of FIG. 4, and the descriptions thereof are omitted. Note that steps S27 and S28 in FIG. 7 are the same steps as steps S18 and S17 in FIG. 4, respectively. That is, FIG. 7 illustrates the flowchart in which step S17 and step S18 of the flowchart in FIG. 4 are conducted in a reverse order.

In Comparative Example 2, the field-effect transistor 10 of FIG. 1 was fabricated by following steps S11 through S16, S27 and S28 illustrated in FIG. 7, and characteristics of the field-effect transistor 10 were evaluated. Note that a field-effect transistor of Comparative Example 2 indicates the field-effect transistor 10 fabricated by following the steps S11 through S16, S27 and S28 illustrated in FIG. 7. The field-effect transistor of Comparative Example 2 differs from that of Example 1 in that the field-effect transistor of Comparative Example 2 was fabricated by carrying out the heat treatment step S27 before the patterning step S28 in which the Mg—In oxide film was patterned to form geometry of the active layer 16.

Figure 8:
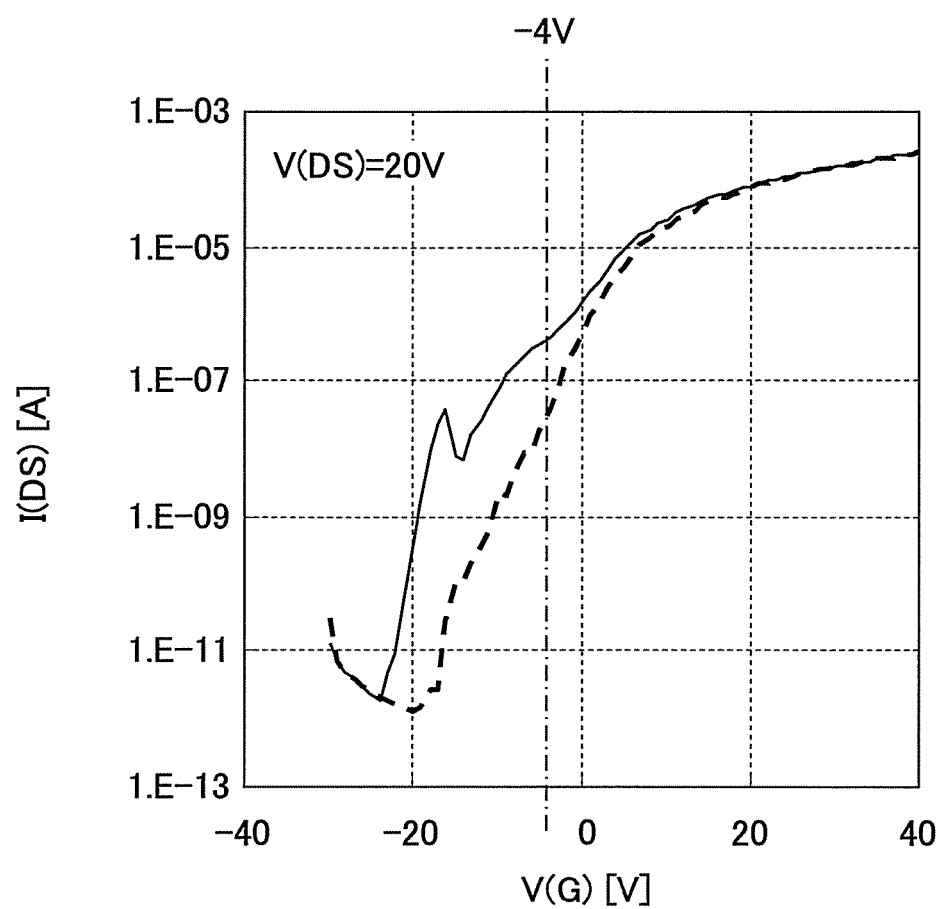
FIG. 8 is a graph illustrating characteristics of the field-effect transistor obtained in Comparative Example 2.

FIG. 8 is a graph illustrating characteristics of the field-effect transistor of Comparative Example 2. FIG. 8 illustrates a relationship between a gate voltage V(G) and a source-drain current interval I(DS) in the field-effect transistor of Comparative Example 2 when a source-drain voltage V(DS) is set at 20 V. In Comparative Example 8, two samples of the field-effect transistor were fabricated by following the same steps S11 through S16, S27 and S28 illustrated in FIG. 7, and characteristics of the two samples were evaluated. In FIG. 8, a solid line and a dotted line illustrate the results of the characteristics of the two samples.

As illustrated in FIG. 8, although a source-drain current interval I(DS) in a saturation region was comparatively stable, unstable current was flown between the source and drain electrodes in a region where the transistor of Example 1 exhibited an excellent OFF-state (i.e., a region where the gate voltage V(G)<−4 V). The transistor exhibited OFF-to-ON behaviors, however, the gate voltage at which the source-drain current interval I(DS) started to increase was approximately −20 V. Further, FIG. 8 also illustrates that there was significant variability in the characteristics between the two samples.

Moreover, when the evaluation was conducted on the characteristics in the two samples obtained before etching (i.e., samples obtained between steps S27 and S28 in FIG. 7), the result showed no specific behaviors that had been observed at a voltage region where the transistor should exhibit an OFF-state illustrated in FIG. 8. Such specific behaviors at a voltage region where the transistor should exhibit an OFF-state illustrated in FIG. 8 may have been obtained due to the damage that occurred in the active layer 16 in the etching step (i.e., step S28 in FIG. 7).

As can be clear from the results of Example 1 and Comparative Example 2, the field-effect transistor having the oxide semiconductor mainly composed of Mg and In as an active layer may be fabricated without causing the damage to its active layer or the degradation in the OFF-state transistor characteristics, provided that the heat-treatment step was added subsequent to the patterning step (step S17 in FIG. 4) in the steps of its fabrication method. Note that, in the patterning step (step S17 in FIG. 4), the Mg—In oxide film was patterned by photolithography and wet-etching to form the active layer 16, and in the heat-treatment step (step S18 in FIG. 14), the active layer was heat-treated at a temperature equal to or higher than the deposition temperature of the Mg—In oxide film. This indicates that the damage that occurred in the active layer 16 in the patterning step was repaired by carrying out the heat-treatment step.

Examples 2 Through 5

Figure 9:
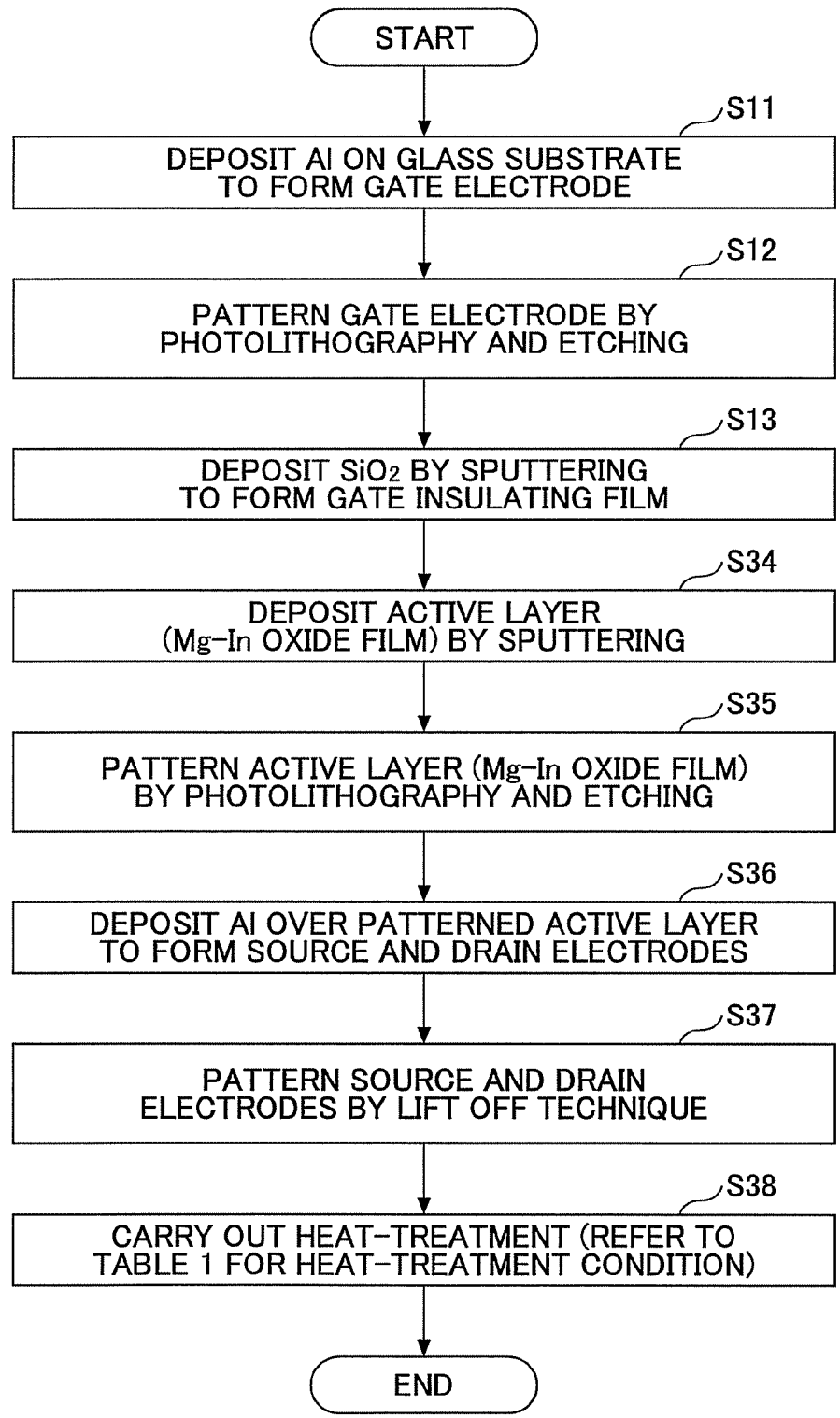
FIG. 9 is a flowchart illustrating a method for fabricating the field-effect transistor according to the embodiment in Examples 2 through 5.

FIG. 9 is a flowchart illustrating a method for fabricating the field-effect transistor of Examples 2 through 5. In FIG. 9, the same reference numerals are assigned to steps identical to those of FIG. 4, and the descriptions thereof are omitted. In Examples 2 through 5, the field-effect transistor 20 of FIG. 2 was fabricated by following steps S11 through S13 and S34 through S38 illustrated in FIG. 9, and characteristics of the field-effect transistor 20 were evaluated. Note that field-effect transistors of Examples 2 through 5 indicate the field-effect transistor 20 fabricated by following the steps S11 through S13, and S34 through S38 illustrated in FIG. 9. Note that temperatures in the heat-treatment step (step S38) were differentiated in the fabrication method between the field-effect transistors of Examples 2 through 5.

The method for fabricating the field-effect transistor of Examples 2 through 5 is described below with reference to FIG. 9. In Examples 2 through 5, steps identical to steps S11 to S13 illustrated in FIG. 4 were initially carried out (steps S11 through S13). In step S34, the Mg—In oxide film was deposited by sputtering to form the active layer 16. In this step, a polycrystalline sintered member having a composition of $In_2MgO_4$ was used as a sputtering target. A mixture of argon (Ar) and oxygen ($O_2$) was used as a sputtering atmosphere, and a ratio of oxygen to argon was adjusted at 1.5%. Subsequently, the Mg—In oxide film with a thickness of 100 nm was deposited by sputtering at the sputter power of 150 W for 25 minutes (step S34). Note that the temperature of the substrate 11 was not controlled in step S34. As already known, the substrate temperature of the substrate 11 rises spontaneously during the sputtering but it remains at 40° C. or lower. Therefore, the deposition temperature of the Mg—In oxide film is 40° C. or lower.

In step S35, the Mg—In oxide film deposited by sputtering in step S34 was patterned to form geometry of the active layer 16 by photolithography or wet-etching (step S35). In step S36, a resist was applied over the active layer 16, the resist on the active layer 16 was exposed and developed so as to form a resist layer having respective patterns of the source electrode 14 and the drain electrode 15, and aluminum (Al) was subsequently deposited over the resist layer having the respective patterns of the source electrode 14 and the drain electrode 15 (step S36).

In step S37, aluminum (Al) deposited in step S36 was formed into geometries of the source electrode 14 and the drain electrode 15 by removing the resist layer formed in step S36 (lift-off technique). As a result, a transistor having a channel length of 50 μm and a channel width of 2000 μm was formed.

In step S38, the transistor formed in step S37 was subsequently heat-treated at a temperature equal to or higher than the deposition temperature of the Mg—In oxide film (i.e., at 40° C. or higher in Examples 2 through 5). Note that in the heat treatment step of step S38, it is sufficient to heat-treat at least a portion of the active layer 16 that forms the channel region. Specifically, the transistor formed in step S37 was placed in an oven and was heat-treated in air for one hour at different heating temperatures (i.e., heat-treatment temperatures) in Examples 2 through 5 as illustrated in Table 1 below. Note that the heating temperatures were measured by a thermocouple provided in the oven.

TABLE 1

| | Heat-Treatment Condition | | |
|---|---|---|---|
| Example | Temperature [° C.] | Time | Atmosphere |
| Example 2 | 200 | 1 hour | Air |
| Example 3 | 250 | 1 hour | Air |
| Example 4 | 270 | 1 hour | Air |
| Example 5 | 300 | 1 hour | Air |

Figure 10:
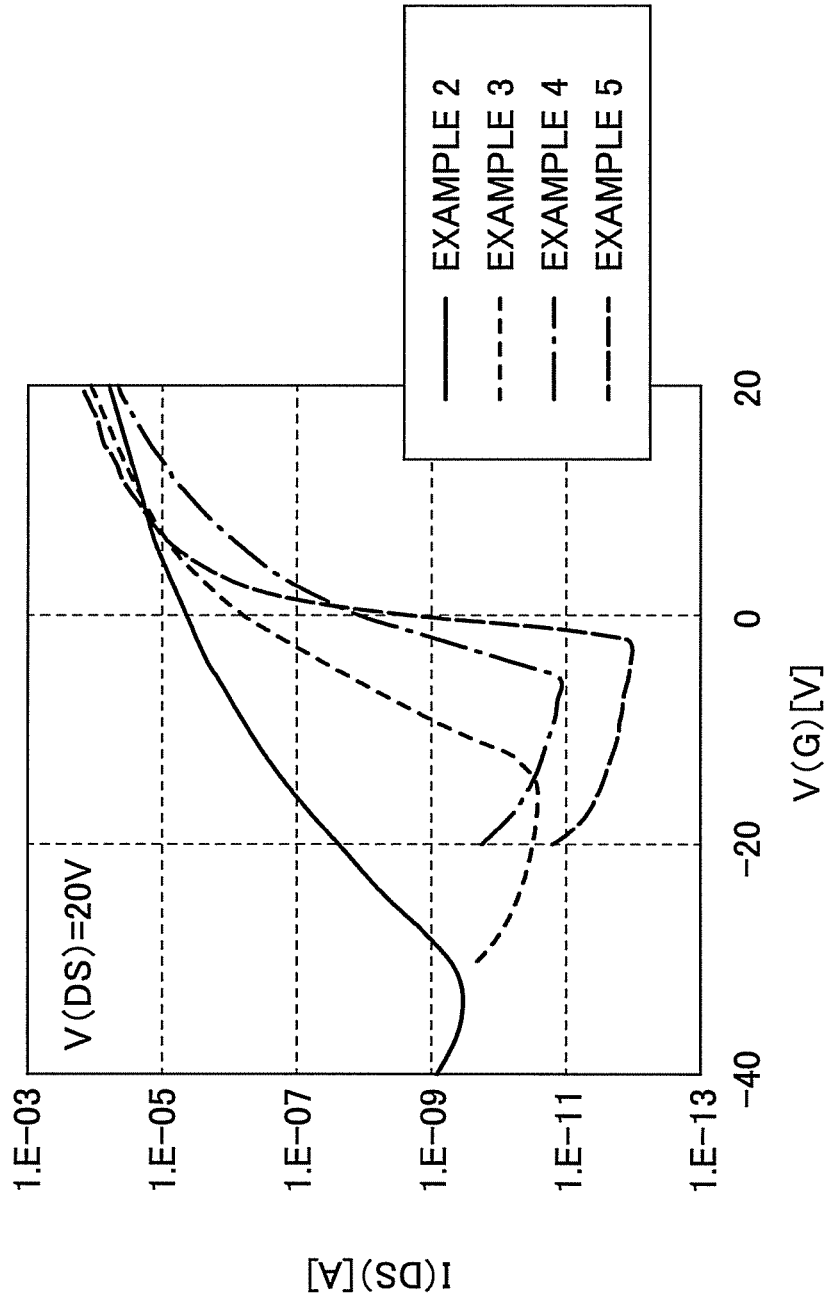
FIG. 10 is a graph illustrating characteristics of the field-effect transistor according to the embodiment obtained in Examples 2 through 5.

The field-effect transistor fabricated by following the above steps S11 through S13 and S34 through S38 is a typical n-type transistor that employs electrons as carriers. FIG. 10 is a graph illustrating characteristics of the field-effect transistor of Examples 2 through 5. FIG. 10 illustrates a relationship between a gate voltage V(G) and a source-drain current interval I(DS) in the field-effect transistor of Examples 2 through 5 when a source-drain voltage V(DS) is set at 20 V.

Table 2 illustrates the voltages at current rise, field-effect motilities, and ON/OFF ratios obtained in Examples 2 through 5. Note that the "voltage at current rise" indicates the gate voltage V(G) at which the amount of the source-drain current interval I(DS) starts to increase, the "field-effect mobility" indicates the value computed in the saturated region, and the ON/OFF ratio indicates the ratio between the value of the source-drain interval current I(DS) at the gate voltage V(G)=20 V and the minimum value of the source-drain interval current I(DS).

Figure 11:
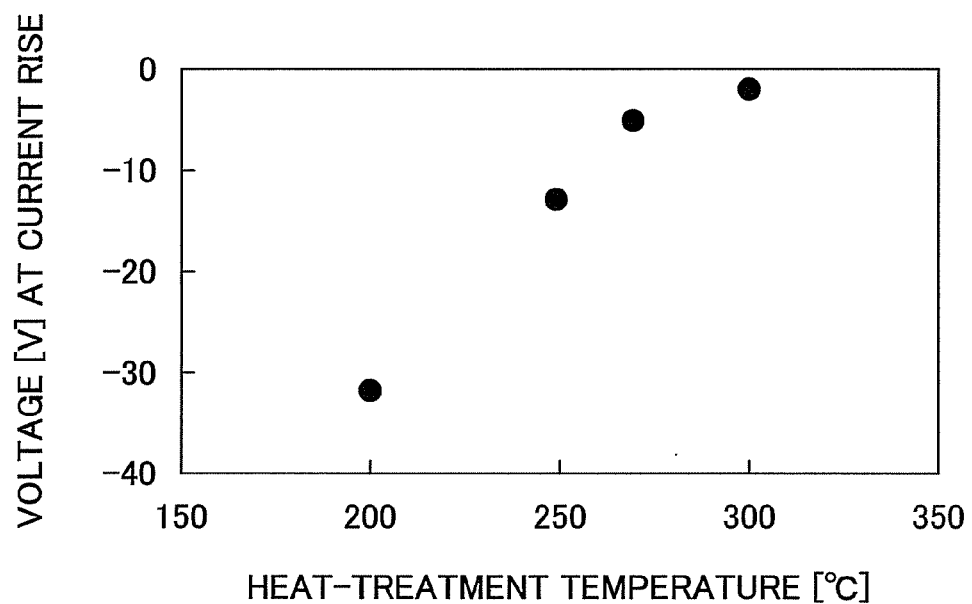
FIG. 11 is a graph illustrating heat-treatment temperature dependencies of the voltage at current rise in the field-effect transistor according to the embodiment obtained in Examples 2 through 5.
Figure 12:
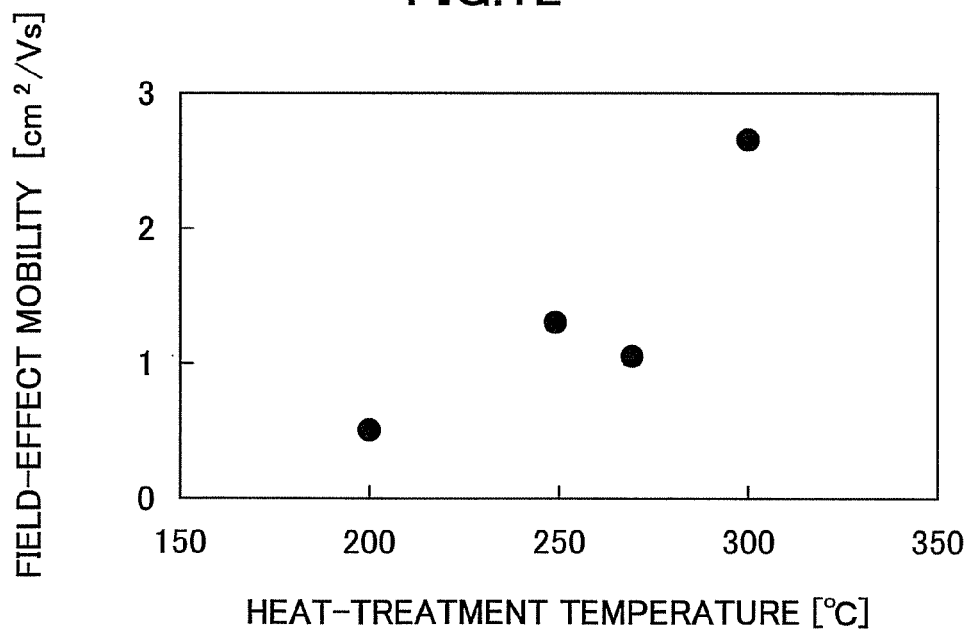
FIG. 12 is a graph illustrating heat-treatment temperature dependencies of field-effect mobility in the field-effect transistor according to the embodiment obtained in Examples 2 through 5.

FIG. 11 is a graph illustrating heat-treatment temperature dependencies of the voltage at current rise in the field-effect transistor of Examples 2 through 5, and FIG. 12 is a graph illustrating heat-treatment temperature dependencies of the field-effect mobility in the field-effect transistor of Examples 2 through 5.

TABLE 2

| | TFT Characteristics | | |
|---|---|---|---|
| Example | Voltage [V] at Current Rise | Field-effect Mobility [cm$^2$/Vs] | ON/OFF Ratio |
| Example 2 | −32 | 0.45 | 2.0 * 10$^5$ |
| Example 3 | −13 | 1.28 | 3.5 * 10$^6$ |
| Example 4 | −5 | 1.04 | 2.2 * 10$^5$ |
| Example 5 | −2 | 2.66 | 2.7 * 10$^8$ |

As illustrated in FIGS. 10 through 12 and Table 2, if the heating temperature (heat-treatment temperature) is equal to or greater than the deposition temperature of the Mb—In oxide film utilized as the active layer 16, a certain level of effect may be obtained for preventing the damage in the active layer 16 in the patterning step; however, the heating temperature is preferably 200° C. or higher, and more preferably is in a range of 300° C. to 500° C. If the heating temperature (heat-treatment temperature) is lower than the above range, the voltage at current rise results in the negative value and a large absolute value. The voltage at current rise approaches 0 V as the heating temperature increases, and stays constant when the heating temperature is 300° C. or higher. The field-effect mobility and ON/OFF ratio also increase with the increase in the heating temperature. In particular, the ON/OFF ratio exhibits a substantial increase when the heat-treatment temperature is raised from 270° C. (Example 4) to 300° C. (Example 5). Note that temperature dependencies of the heat-treatment effect may vary with the film thickness of the active layer, a kind of the gate insulating film or a state of the active layer, and hence, the heat-treatment temperature may be appropriately set based on desired characteristics to be obtained.

If the heat-treatment temperature is set at 200° C. or higher, utilizable TFT characteristics may be obtained (Example 2). If the heat-treatment temperature is set at 300° C. or higher, a sufficient heat-treatment effect may be observed in any types of transistors. Further, particularly preferable characteristics for TFT, which exhibit sufficiently high field-effect mobility, sufficiently high ON/OFF ratio, and rapidly rise of the source-drain interval current I(DS) at 0 V, may be obtained if the heat-treatment temperature is set at 300° C. or higher (Example 5). However, if the heat-treatment temperature is raised higher than 500° C., the electric contact between the active layer 16 and the source and drain electrodes 14 and 15 deteriorates, thereby decreasing the ON-current. Therefore, it is preferable that the heating temperature (heat-treatment temperature) is 500° C. or lower.

As illustrated in the above Embodiment, Examples and Comparative Examples, the field-effect transistor having the oxide semiconductor mainly composed of Mg and In as an active layer may be fabricated without causing the damage to its active layer or the degradation in the OFF-state transistor characteristics, provided that the heat-treatment step was added subsequent to the patterning step in the steps of its fabrication method. Note that, in the patterning step, the Mg—In oxide film was patterned by photolithography and wet-etching to form the active layer 16, and in the heat-treatment step, the active layer was heat-treated at a temperature equal to or higher than the deposition temperature of the Mg—In oxide film.

The results of Examples and Comparative Examples have shown that the field-effect transistor having effective transistor characteristics may be obtained when the heat-treatment temperature is set at 200° C. or higher in the heat-treatment step.

Further, the results of Examples and Comparative Examples have shown that the field-effect transistor having significantly effective transistor characteristics may be obtained when the heat-treatment temperature is set in a range of 300° C. to 500° C. in the heat-treatment step.

Examples 6 Through 9

The concentration of hydrogen atoms in each of the active layers 16 of the field-effect transistors of Examples 2 through 5 was measured by a secondary ion mass spectrometry (SIMS) and the results were obtained as Examples 6 through 9. The concentration of hydrogen atoms was measured in areas of the active layer 16 where neither the source electrode 14 made of aluminum (Al) nor the drain electrode 15 were layered, and the analysis was conducted in the depth direction.

Comparative Example 3

The concentration of hydrogen atoms in an active layer 16 of the field-effect transistor of Comparative Example 1 was measured by SIMS and the result was obtained as Comparative Example 3. The concentration of hydrogen atoms was measured in areas of the active layer 16 where neither the source electrode 14 made of aluminum (Al) nor the drain electrode 15 were layered, and the analysis was conducted in the depth direction.

Comparative Example 4

In order to obtain information on an active layer receiving no damage in the patterning step, a sample of the field-effect transistor of Example 2 was fabricated without carrying out steps S35 and S37 (see FIG. 9). That is, the fabricated sample of the field-effect transistor of Example 2 had no damage in the active layer in the patterning step and was still heat-treated at 300° C. in the heat-treatment step. With this sample, the concentration of hydrogen atoms in the active layer 16 was measured by SIMS in the similar manner as Examples 6 through 9 and the result was obtained as Comparative Example 4.

Figure 13:
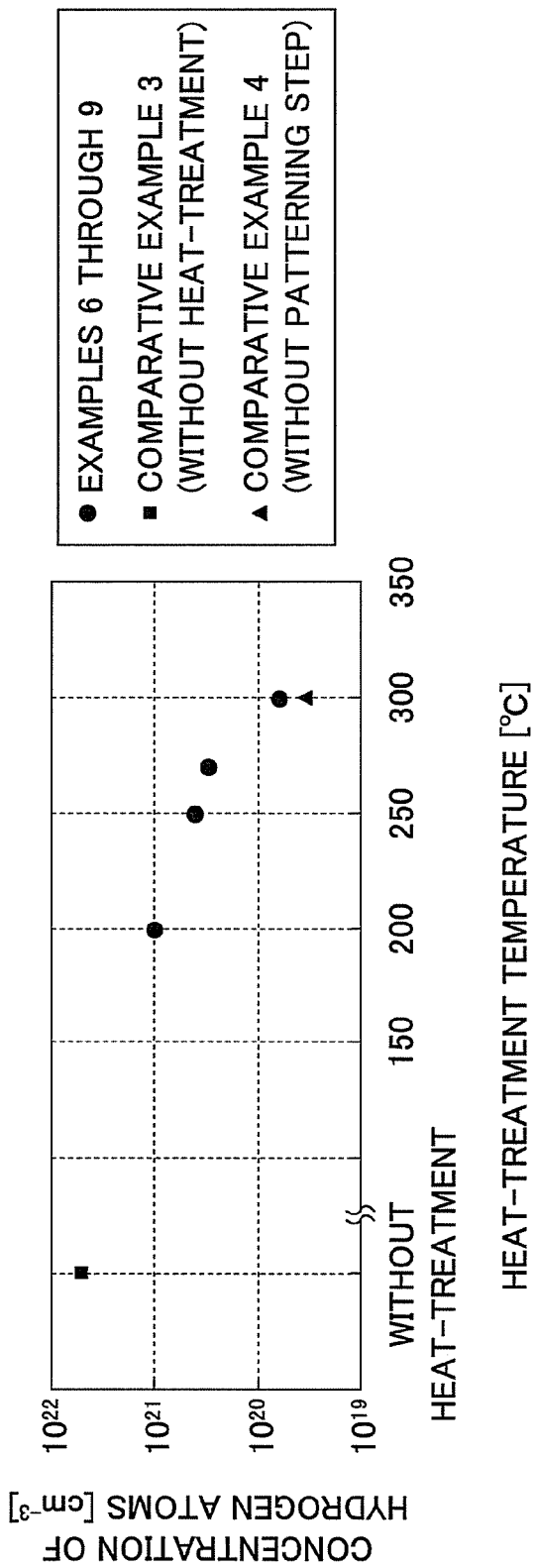
FIG. 13 is a graph illustrating the concentration of hydrogen atoms in the active layer measured near an interface between the active layer and the gate insulating film in Examples 6 through 9, and Comparative Examples 3 and 4.

FIG. 13 is a graph illustrating the concentration of hydrogen atoms in the active layer 16 measured near an interface between the active layer 16 and the gate insulating film 13 in Examples 6 through 9, and Comparative Examples 3 and 4. As illustrated in FIG. 13, the lowest concentration of hydrogen atoms was obtained in the sample of Comparative Example 4 that was fabricated without carrying out the patterning step. This shows that hydrogen atoms were incorporated in the active layer 16 in the patterning step. By contrast, the highest concentration of hydrogen atoms was obtained in the sample of Comparative Example 3 that was fabricated without carrying out the heat-treatment step after the patterning step. This illustrates that the heat-treatment provides an effect of lowering the concentration of hydrogen atoms (based on the results of Examples 6 through 9).

As can be clear from the results of Examples 6 through 9, the higher the heat-treatment temperature, the higher the effect of lowering the concentration of hydrogen will be. If the heat-treatment temperature is set at 200° C. or higher, the concentration of hydrogen atoms may result in $10^{21}/cm^3$ or lower. As a result, the field-effect transistor having good characteristics may be obtained. Further, if the heat-treatment temperature is set at 300° C. or higher, the concentration of hydrogen atoms may result in $10^{20}/cm^3$ or lower, which is comparable to that of the sample having no damage (i.e., Comparative Example 4). As a result, the field-effect transistor having excellent characteristics may be obtained.

The above results show that the heat-treatment may improve transistor characteristics. This suggests that the damage in the active layer caused by the generation of excess carriers or carrier trapping be repaired if the heat-treatment step, where the active layer is heat-treated at a temperature equal to or higher than the deposition temperature of Mg—In oxide film, is carried out subsequent to the patterning step where the active layer is formed. In particular, hydrogen atoms are incorporated in the active layer while patterning the active layer by wet-etching, which generates carriers, deteriorating transistor characteristics. However, excellent transistor characteristics may be achieved if the concentration of hydrogen atoms is lowered by the later step of heat-treatment.

The preferred embodiments and examples are described heretofore. However, the present invention is not limited to the aforementioned Embodiment, Examples, and Comparative Examples. Various modifications and substitutions may be made to the above Embodiment, Examples, and Comparative Examples without departing from the scope of the present invention.

The disclosed technologies may provide a method for fabricating a field-effect transistor having an active layer mainly containing Mg and In capable of preventing damage to the active layer while patterning the active layer by etching in a patterning step, and a field-effect transistor fabricated by such a method so that the produced field-effect transistor receives little damage.

The descriptions of exemplary embodiments for implementing the invention have been provided heretofore. The present invention is not limited to these embodiments, but various variations and modifications may be made without departing from the scope of the present invention.

The present application is based on Japanese priority application No. 2009-163076 filed on Jul. 9, 2009, and Japanese priority application No. 2010-131676 filed on Jun. 9, 2010, with the Japanese Patent Office, the entire contents of which are hereby incorporated by reference.

What is claimed is:

1. A field-effect transistor comprising:
a gate electrode configured to apply a gate voltage;
a source electrode and a drain electrode configured to acquire a current;
an active layer arranged adjacent to the source electrode and the drain electrode, the active layer forming a channel region and having an oxide semiconductor mainly containing magnesium and indium; and
a gate insulating layer arranged between the gate electrode and the active layer,
wherein a concentration of hydrogen atoms in the active layer near an interface between the active layer and the gate insulating film is equal to or lower than $10^{21}/cm^3$,
wherein the oxide semiconductor contains $In_2MgO_4$.

2. The field-effect transistor as claimed in claim 1, wherein the concentration of hydrogen atoms in the active layer near the interface between the active layer and the gate insulating film is equal to or lower than $10^{20}/cm^3$.

3. The field-effect transistor as claimed in claim 1, wherein in the oxide semiconductor, at least one of aluminum (Al) and gallium (Ga) is substituted for part of indium (In).

4. The field-effect transistor as claimed in claim 1, wherein in the oxide semiconductor, at least one of calcium (Ca), strontium (Sr) and barium (Ba) is substituted for part of magnesium (Mg).

5. The field-effect transistor as claimed in claim 1, wherein in the oxide semiconductor, at least one of aluminum (Al) and gallium (Ga) is substituted for part of indium (In), and at least one of calcium (Ca), strontium (Sr) and barium (Ba) is substituted for part of magnesium (Mg).

6. The field-effect transistor as claimed in claim 1, wherein at least part of the oxide semiconductor includes a spinel structure or an olivine structure.

7. The field-effect transistor as claimed in claim 1, wherein at least part of the oxide semiconductor is amorphous.

8. The field-effect transistor as claimed in claim 1, wherein in the oxide semiconductor, at least one of nitrogen and fluorine is substituted for part of oxygen.

* * * * *